(12) United States Patent
Hurrell et al.

(10) Patent No.: US 7,274,321 B2
(45) Date of Patent: Sep. 25, 2007

(54) ANALOG TO DIGITAL CONVERTER

(75) Inventors: Christopher Peter Hurrell, Cookham (GB); Colin Gerard Lyden, Baltimore (IE)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 11/273,220

(22) Filed: Nov. 14, 2005

(65) Prior Publication Data

US 2006/0208935 A1 Sep. 21, 2006

Related U.S. Application Data

(60) Provisional application No. 60/663,653, filed on Mar. 21, 2005.

(51) Int. Cl.
*H03M 1/12* (2006.01)

(52) U.S. Cl. .................. 341/156; 341/155; 341/172

(58) Field of Classification Search ........... 341/156, 341/155, 143, 164, 159, 139, 172
See application file for complete search history.

(56) References Cited

U.S. PATENT DOCUMENTS

| | | | | |
|---|---|---|---|---|
| 4,769,755 A | * | 9/1988 | Yamakawa | 250/369 |
| 4,945,359 A | * | 7/1990 | Yamakido | 341/143 |
| 4,999,628 A | * | 3/1991 | Kakubo et al. | 341/139 |
| 5,313,206 A | * | 5/1994 | Davies et al. | 341/156 |
| 5,581,252 A | * | 12/1996 | Thomas | 341/144 |
| 5,990,948 A | * | 11/1999 | Sugiki | 348/250 |
| 6,104,329 A | * | 8/2000 | Kawano | 341/139 |
| 6,239,734 B1 | * | 5/2001 | Bae et al. | 341/164 |
| 6,476,749 B1 | * | 11/2002 | Yeap et al. | 341/155 |
| 6,489,904 B1 | * | 12/2002 | Hisano | 341/120 |
| 6,515,606 B2 | * | 2/2003 | Lyden | 341/143 |
| 6,518,907 B2 | * | 2/2003 | Tsai | 341/155 |
| 6,608,580 B2 | * | 8/2003 | Hsueh | 341/155 |
| 6,614,373 B1 | * | 9/2003 | Frazier | 341/143 |
| 6,646,583 B1 | * | 11/2003 | Fossum et al. | 341/144 |
| 6,664,911 B2 | * | 12/2003 | Hirai | 341/159 |
| 6,683,550 B2 | * | 1/2004 | Al-Awadhi | 341/143 |
| 6,703,961 B2 | * | 3/2004 | Mueck et al. | 341/161 |
| 6,734,817 B2 | * | 5/2004 | Naka et al. | 341/155 |
| 6,864,874 B1 | * | 3/2005 | Ozawa | 345/99 |
| 6,999,018 B2 | * | 2/2006 | Aeby et al. | 341/155 |
| 2003/0034909 A1 | * | 2/2003 | Wong | 341/155 |

* cited by examiner

*Primary Examiner*—Jean Bruner Jeanglaude
(74) *Attorney, Agent, or Firm*—Wolf, Greenfield & Sacks, P.C.

(57) ABSTRACT

A analog to digital converter, comprising: an input for receiving an input signal to be digitized; a first converter core for performing a first part of an analog to digital conversion, and for outputting a first digital result; a first residue calculator for calculating a first residue as a difference between the input signal and the first digital result; a second converter core for performing a second part of the analog to digital conversion by converting the first residue; wherein at least one of the first and second converter cores comprises at least three analog to digital conversion engines and a controller for controlling the operation of the engines such that the engines collaborate to perform a successive approximation search, and wherein a plurality of bits can be determined during a single trial step of the successive approximation search.

18 Claims, 11 Drawing Sheets

3 collaborating ADCs with binary weighted caps

Correctly determines answer to be between 24 and 25
Input = 24.75

| Trial | ADC | 32 | 16 | 8 | 4 | 2 | 1 | TOTAL | |
|---|---|---|---|---|---|---|---|---|---|
| T1 | E1 | 0 | 1 | 0 | 0 | 0 | 0 | 16 | |
| T1 | E2 | 1 | 0 | 0 | 0 | 0 | 0 | 32 | Reject |
| T1 | E3 | 1 | 1 | 0 | 0 | 0 | 0 | 48 | Reject |
| T2 | E1 | 0 | 1 | 0 | 1 | 0 | 0 | 20 | |
| T2 | E2 | 0 | 1 | 1 | 0 | 0 | 0 | 24 | |
| T2 | E3 | 0 | 1 | 1 | 1 | 0 | 0 | 28 | Reject |
| T3 | E1 | 0 | 1 | 1 | 0 | 0 | 1 | 25 | Reject |
| T3 | E2 | 0 | 1 | 1 | 0 | 1 | 0 | 26 | Reject |
| T3 | E3 | 0 | 1 | 1 | 0 | 1 | 1 | 27 | Reject |
| RESULT | | 0 | 1 | 1 | 0 | 0 | 0 | 24 | Correct |

Fig. 5A

3 collaborating ADCs with binary weighted caps

Bit weight of 16 wrongly rejected on first bit trial resulting in incorrect result of 15.
Input = 24.75

| Trial | ADC | 32 | 16 | 8 | 4 | 2 | 1 | TOTAL | |
|---|---|---|---|---|---|---|---|---|---|
| T1 | E1 | 0 | 1 | 0 | 0 | 0 | 0 | 16 | Reject! |
| T1 | E2 | 1 | 0 | 0 | 0 | 0 | 0 | 32 | Reject |
| T1 | E3 | 1 | 1 | 0 | 0 | 0 | 0 | 48 | Reject |
| T2 | E1 | 0 | 0 | 0 | 1 | 0 | 0 | 4 | |
| T2 | E2 | 0 | 0 | 1 | 0 | 0 | 0 | 8 | |
| T2 | E3 | 0 | 0 | 1 | 1 | 0 | 0 | 12 | |
| T3 | E1 | 0 | 0 | 1 | 1 | 0 | 1 | 13 | |
| T3 | E2 | 0 | 0 | 1 | 1 | 1 | 0 | 14 | |
| T3 | E3 | 0 | 0 | 1 | 1 | 1 | 1 | 15 | |
| RESULT | | 0 | 0 | 1 | 1 | 1 | 1 | 15 | |

Fig. 5B

4 collaborating ADCs with Redundant bits and Shift caps

Correctly determines input as being between 24.5 and 25.5
Input = 24.75

| Trial | ADC | 32 | 16 | R 16 | S -8 | 8 | 4 | R 4 | S -2 | 2 | 1 | R 1 | S -0.5 | TOTAL | |
|---|---|---|---|---|---|---|---|---|---|---|---|---|---|---|---|
| T1 | E1 | 0 | 0 | 1 | 1 | 0 | 0 | 0 | 0 | 0 | 0 | 0 | 0 | 8 | |
| T1 | E2 | 0 | 1 | 1 | 1 | 0 | 0 | 0 | 0 | 0 | 0 | 0 | 0 | 24 | |
| T1 | E3 | 1 | 0 | 1 | 1 | 0 | 0 | 0 | 0 | 0 | 0 | 0 | 0 | 40 | Reject |
| T1 | E4 | 1 | 1 | 1 | 1 | 0 | 0 | 0 | 0 | 0 | 0 | 0 | 0 | 56 | Reject |
| T2 | E1 | 0 | 1 | 1 | 1 | 0 | 0 | 1 | 1 | 0 | 0 | 0 | 0 | 26 | Reject |
| T2 | E2 | 0 | 1 | 1 | 1 | 0 | 1 | 1 | 1 | 0 | 0 | 0 | 0 | 30 | Reject |
| T2 | E3 | 0 | 1 | 1 | 1 | 1 | 0 | 1 | 1 | 0 | 0 | 0 | 0 | 34 | Reject |
| T2 | E4 | 0 | 1 | 1 | 1 | 1 | 1 | 1 | 1 | 0 | 0 | 0 | 0 | 38 | Reject |
| T3 | E1 | 0 | 1 | 1 | 1 | 0 | 0 | 0 | 1 | 0 | 0 | 1 | 1 | 22.5 | |
| T3 | E2 | 0 | 1 | 1 | 1 | 0 | 0 | 0 | 1 | 0 | 1 | 1 | 1 | 23.5 | |
| T3 | E3 | 0 | 1 | 1 | 1 | 0 | 0 | 0 | 1 | 1 | 0 | 1 | 1 | 24.5 | |
| T3 | E4 | 0 | 1 | 1 | 1 | 0 | 0 | 0 | 1 | 1 | 1 | 1 | 1 | 25.5 | Reject |
| RESULT | | 0 | 1 | 1 | 1 | 0 | 0 | 0 | 1 | 1 | 0 | 1 | 1 | 24.5 | |

Fig. 5C

4 collaborating ADCs with Redundant bits and Shift caps

Bit weight of 24 wrongly rejected on first bit trial.
Still correctly determines input as being between 24.5 and 25.5.
Input = 24.75

| Trial | ADC | 32 | 16 | R 16 | S -8 | 8 | 4 | R 4 | S -2 | 2 | 1 | R 1 | S -0.5 | TOTAL | |
|---|---|---|---|---|---|---|---|---|---|---|---|---|---|---|---|
| T1 | E1 | 0 | 0 | 1 | 1 | 0 | 0 | 0 | 0 | 0 | 0 | 0 | 0 | 8 | |
| T1 | E2 | 0 | 1 | 1 | 1 | 0 | 0 | 0 | 0 | 0 | 0 | 0 | 0 | 24 | Reject! |
| T1 | E3 | 1 | 0 | 1 | 1 | 0 | 0 | 0 | 0 | 0 | 0 | 0 | 0 | 40 | Reject |
| T1 | E4 | 1 | 1 | 1 | 1 | 0 | 0 | 0 | 0 | 0 | 0 | 0 | 0 | 56 | Reject |
| T2 | E1 | 0 | 0 | 1 | 1 | 0 | 0 | 1 | 1 | 0 | 0 | 0 | 0 | 10 | |
| T2 | E2 | 0 | 0 | 1 | 1 | 0 | 1 | 1 | 1 | 0 | 0 | 0 | 0 | 14 | |
| T2 | E3 | 0 | 0 | 1 | 1 | 1 | 0 | 1 | 1 | 0 | 0 | 0 | 0 | 18 | |
| T2 | E4 | 0 | 0 | 1 | 1 | 1 | 1 | 1 | 1 | 0 | 0 | 0 | 0 | 22 | |
| T3 | E1 | 0 | 0 | 1 | 1 | 1 | 1 | 1 | 1 | 0 | 0 | 1 | 1 | 22.5 | |
| T3 | E2 | 0 | 0 | 1 | 1 | 1 | 1 | 1 | 1 | 0 | 1 | 1 | 1 | 23.5 | |
| T3 | E3 | 0 | 0 | 1 | 1 | 1 | 1 | 1 | 1 | 1 | 0 | 1 | 1 | 24.5 | |
| T3 | E4 | 0 | 0 | 1 | 1 | 1 | 1 | 1 | 1 | 1 | 1 | 1 | 1 | 25.5 | Reject |
| RESULT | | 0 | 0 | 1 | 1 | 1 | 1 | 1 | 1 | 1 | 0 | 1 | 1 | 24.5 | |

Fig. 5D

4 collaborating ADCs with Redundant bits and Shift caps
Correctly determines input as being between 24.5 and 25.5
Input = 24.75

| Trial | ADC | 16 | 16 | 16 | R 16 | S -8 | 4 | 4 | 4 | R 4 | S -2 | 1 | 1 | 1 | R 1 | S -0.5 | TOTAL | |
|---|---|---|---|---|---|---|---|---|---|---|---|---|---|---|---|---|---|---|
| T1 | E1 | 0 | 0 | 0 | 1 | 1 | 0 | 0 | 0 | 0 | 0 | 0 | 0 | 0 | 0 | 0 | 8 | |
| T1 | E2 | 0 | 0 | 1 | 1 | 1 | 0 | 0 | 0 | 0 | 0 | 0 | 0 | 0 | 0 | 0 | 24 | |
| T1 | E3 | 0 | 1 | 1 | 1 | 1 | 0 | 0 | 0 | 0 | 0 | 0 | 0 | 0 | 0 | 0 | 40 | Reject |
| T1 | E4 | 1 | 1 | 1 | 1 | 1 | 0 | 0 | 0 | 0 | 0 | 0 | 0 | 0 | 0 | 0 | 56 | Reject |
| T2 | E1 | 0 | 0 | 1 | 1 | 1 | 0 | 0 | 0 | 1 | 1 | 0 | 0 | 0 | 0 | 0 | 26 | Reject |
| T2 | E2 | 0 | 0 | 1 | 1 | 1 | 0 | 0 | 1 | 1 | 1 | 0 | 0 | 0 | 0 | 0 | 30 | Reject |
| T2 | E3 | 0 | 0 | 1 | 1 | 1 | 0 | 1 | 1 | 1 | 1 | 0 | 0 | 0 | 0 | 0 | 34 | Reject |
| T2 | E4 | 0 | 0 | 1 | 1 | 1 | 1 | 1 | 1 | 1 | 1 | 0 | 0 | 0 | 0 | 0 | 38 | Reject |
| T3 | E1 | 0 | 0 | 1 | 1 | 1 | 0 | 0 | 0 | 0 | 1 | 0 | 0 | 0 | 1 | 1 | 22.5 | |
| T3 | E2 | 0 | 0 | 1 | 1 | 1 | 0 | 0 | 0 | 0 | 1 | 0 | 0 | 1 | 1 | 1 | 23.5 | |
| T3 | E3 | 0 | 0 | 1 | 1 | 1 | 0 | 0 | 0 | 0 | 1 | 0 | 1 | 1 | 1 | 1 | 24.5 | |
| T3 | E4 | 0 | 0 | 1 | 1 | 1 | 0 | 0 | 0 | 0 | 1 | 1 | 1 | 1 | 1 | 1 | 25.5 | Reject |
| RESULT | | 0 | 0 | 1 | 1 | 1 | 0 | 0 | 0 | 0 | 1 | 0 | 1 | 1 | 1 | 1 | 24.5 | |

Fig. 5E

4 collaborating ADCs with Redundant bits and Shift caps
Bit weight of 24 wrongly rejected on first bit trial.
Still correctly determines answer to be between 24.5 and 25.5
Input = 24.75

| Trial | ADC | 16 | 16 | 16 | R 16 | S -8 | 4 | 4 | 4 | R 4 | S -2 | 1 | 1 | 1 | R 1 | S -0.5 | TOTAL | |
|---|---|---|---|---|---|---|---|---|---|---|---|---|---|---|---|---|---|---|
| T1 | E1 | 0 | 0 | 0 | 1 | 1 | 0 | 0 | 0 | 0 | 0 | 0 | 0 | 0 | 0 | 0 | 8 | |
| T1 | E2 | 0 | 0 | 0 | 1 | 1 | 0 | 0 | 0 | 0 | 0 | 0 | 0 | 0 | 0 | 0 | 8 | Reject! |
| T1 | E3 | 0 | 1 | 0 | 1 | 1 | 0 | 0 | 0 | 0 | 0 | 0 | 0 | 0 | 0 | 0 | 24 | Reject |
| T1 | E4 | 1 | 1 | 0 | 1 | 1 | 0 | 0 | 0 | 0 | 0 | 0 | 0 | 0 | 0 | 0 | 40 | Reject |
| T2 | E1 | 0 | 0 | 0 | 1 | 1 | 0 | 0 | 0 | 1 | 1 | 0 | 0 | 0 | 0 | 0 | 10 | |
| T2 | E2 | 0 | 0 | 0 | 1 | 1 | 0 | 0 | 1 | 1 | 1 | 0 | 0 | 0 | 0 | 0 | 14 | |
| T2 | E3 | 0 | 0 | 0 | 1 | 1 | 0 | 1 | 1 | 1 | 1 | 0 | 0 | 0 | 0 | 0 | 18 | |
| T2 | E4 | 0 | 0 | 0 | 1 | 1 | 1 | 1 | 1 | 1 | 1 | 0 | 0 | 0 | 0 | 0 | 22 | |
| T3 | E1 | 0 | 0 | 0 | 1 | 1 | 1 | 1 | 1 | 1 | 1 | 0 | 0 | 0 | 1 | 1 | 22.5 | |
| T3 | E2 | 0 | 0 | 0 | 1 | 1 | 1 | 1 | 1 | 1 | 1 | 0 | 0 | 1 | 1 | 1 | 23.5 | |
| T3 | E3 | 0 | 0 | 0 | 1 | 1 | 1 | 1 | 1 | 1 | 1 | 0 | 1 | 1 | 1 | 1 | 24.5 | |
| T3 | E4 | 0 | 0 | 0 | 1 | 1 | 1 | 1 | 1 | 1 | 1 | 1 | 1 | 1 | 1 | 1 | 25.5 | Reject |
| RESULT | | 0 | 0 | 1 | 1 | 1 | 0 | 0 | 0 | 0 | 1 | 0 | 1 | 1 | 1 | 1 | 24.5 | |

Fig. 5F

ANALOG TO DIGITAL CONVERTER

FIELD OF INVENTION

The present invention relates to an analog to digital converter using a plurality of conversion cores, at least one of which comprises plurality of conversion engines acting in a co-operative state to allow multiple bits to be examined at each trial.

BACKGROUND OF THE INVENTION

Users of analog to digital converters generally wish to see high conversion accuracy and high conversion rates. These objectives are generally opposed, and become more difficult to achieve when a user also seeks for such devices to be relatively inexpensive.

Flash converters are known to provide high conversion speed, albeit at increased cost and with limited resolution. In essence a flash converter consists of a plurality of comparators, each comparator connected to a respective tap on a resistor chain such that each comparator is responsible for testing for one, and only one, of the possible digital outputs. Therefore an 8 bit flash converter requires 255 individual comparators to be fabricated therein, each connected to a respective tap of a resistor chain. Each comparator compares an input signal with its respective reference signal, and then a conversion circuit is responsive to the output of each of the comparators and uses this to determine where a transition between two adjacent comparators occurs so as to provide a digital output word. The formation of this number of comparators can result in a relatively power hungry device having a relatively large input capacitance.

Where reduced cost and/or greater accuracy is required, then it is known to use a successive approximation converter. A successive approximation converter performs successive bit trials to see, whether, once the bit is set if the analog value that it is converting is greater or less than the equivalent value represented by the bit being trialled, and the sum of any previous kept bits. Thus, a successive approximation converter seeking to produce an 8 bit output has to perform 8 bit trials.

U.S. Pat. No. 6,239,734 discloses a analog to digital converter having three converters which co-operate such that each trial can determine two bits within the digital word. An example shown in FIG. 7 of U.S. Pat. No. 6,239,734 discloses the conversion of a 6 bit word where the analog input signal has a value which, when converted, corresponds to "110011". In accordance with the normal successive approximation process, a first register is set to trial the words "100000" however a second register SAR+ is set to trial the word "110000" and a third register SAR− is set to trial the word "010000". In this first trial, the analog value is greater than each of the trial words and hence the first two bits in the trial can be set to "11". In the second trial the two bits being tested are set to "10, 11, and 01" in the registers, respectively, such that the first register trials a bit stream "111000" the SAR+ register trials the bit stream "111100" and the SAR− register trials the bit stream "110100" at the end of this trial the analog value is less than each of the trialled words and hence the next two bits can be set to "00". In the third step, the process is completed when two of the trial words are less than the analog value and the third trial word is not, thereby recovering the word "110011" therefore the conversion of a six bit word is converted in three trials and in general an N bit word is converted in $$\frac{N}{2}$$

trials.

Whilst the performance of the device disclosed in U.S. Pat. No. 6,239,734 looks impressive it suffers from several significant shortcomings. These all result from the fact that in the real world components and systems are noisy. This noise may come via the power supply lines, or it may be self generated thermal noise. In general, when a circuit designer seeks to use three successive approximation converters to do the job that previously had been done by one he can either choose to use three times the die area and sink three times as much current by repeating the original approximation converter design, or he can shrink the size of the converter by using smaller components and reducing the currents. The first option, that is tripling the die area and the power consumption is generally not favoured as it makes the device more expensive to manufacture and less likely to be adopted by users as it eats into their power budget, which is particularly important in the context of mobile devices which are battery powered.

However simply making the individual converters smaller carries a noise penalty. This is because the thermal voltage fluctuations generated across a capacitor are proportional to $$\frac{kT}{C}$$

where k is Boltzmann's constant, T is the temperature in Kelvin and C is the capacitance of the capacitor. It could therefore be seen that smaller capacitors have greater thermal noise appearing at their terminals. In the arrangement of U.S. Pat. No. 6,239,734 thermal noise occurring at any one of the successive approximation converters can result in that converter giving a false result and will skew the entire conversion process. Put another way, although three converters are used rather than making the converter less sensitive to thermal noise, it effectively makes it more sensitive to thermal noise. This probably does not represent an issue with the context of the 6-bit of the converter, but with modern converters requiring 12-bit or greater accuracy, the presence of self generated noise is now a significant factor in analog to digital converter design.

A second important shortcoming of U.S. Pat. No. 6,239,734 is that collaborative bit trials are only possible as long as the miss-match errors between collaborative conversion engines is significantly smaller than the resolution of the converter. This may in practice limit such ADCs to about 10 bits.

SUMMARY OF THE INVENTION

According to a first aspect of the present invention there is provided a analog to digital converter, comprising:

an input for receiving an input signal to be digitised;

a first converter core for performing a first part of an analog to digital conversion, and for outputting a first digital result;

a first residue generator for generating a first residue as a difference between the input signal and the first digital result;

a second converter core for performing a second part of the analog to digital conversion by converting the first residue;

wherein at least one of the first and second converter cores comprises at least three analog to digital conversion engines and a controller for controlling the operation of the engines such that the engines collaborate to perform a successive approximation search.

Preferably the conversion engines collaborate such that a plurality of bits can be determined during a single trial step of the successive approximation search performed in one of the converter cores.

It is thus possible to provide an improved analog to digital converter in which the analog to digital conversion is done in first and second stages. This has a first advantage that a complete conversion need not be performed before starting the next analog to digital conversion. Thus, in a converter having first and second converter cores, the second converter core could be finishing an analog to digital conversion whilst the first converter core is switched to a tracking mode such that it acquires the next analog sample to be converted. Alternatively the first ADC, in addition to tracking and sampling the new input, may also commence converting the new input whilst the second converter is still converting the previous input. A second advantage of performing the conversion in two stages is that although miss-match between collaborative ADCs may limit the number of bits that can be converted in each of the first and second converter cores to about 10 bits of resolution, the overall converter may be now have a resolution close to 20 bits, the resolution of both converters combined. The first and second conversion cores could be implemented using any one of a number of implementing technologies, although FLASH converters and successive approximation converters are preferred. As a further enhancement to throughput, at least one, and preferably both the first and second converter cores comprise at least three successive approximation converter engines arranged in parallel and operating in a co-operative manner such that each successive conversion cycle within a single converter core can determine two bits simultaneously.

Advantageously the analog to digital conversion engines are implemented using switched capacitor analog to digital converters as the capacitor arrays in this converter technology can be simultaneously used to both sample the signal and to digitise it. The use of a switched capacitor array is particularly advantageous since charge redistribution within the switched capacitor array means that it acts to form a residue voltage representative of the difference between the sampled input voltage and the converted analog value of the digital word represented by the switching state of the capacitors in the array.

Where the first conversion core has cooperating switched capacitor successive approximation conversion engines it may be advantageous to perform the conversion of the most significant bit as a single conversion rather than as a collaborative conversion where two bits would be determined in one go. This is because, for the most significant bit, a collaborative trial could result in the voltage occurring on one of the capacitor arrays becoming sufficiently great to switch on parasitic diodes or parasitic transistors within the integrated circuit. This would lead to a loss of charge from the capacitor array.

Advantageously the first residue appears as a residue voltage that is buffered and amplified before being passed to the second analog to digital converter core. This stage of amplification improves the resolution and noise performance of the converter as the size of the least significant bit that needs to be resolved by the second converter core is many times, typically in the range 8 to 64 times the size that would need to be resolved if only a single conversion core was used.

Advantageously, in use, the first converter is set to track the analog signal to be converted during at least the period it takes the second converter core to perform its conversion. There may also be a period when neither converter core is performing a conversion, but the first converter core is still performing signal acquisition. This means that, when compared to a successive approximation converter having only a single conversion core and converting at the same rate, the signal acquisition time is lengthened. Allowing a greater time period to acquire the signal means that the RC time constant of the input stage of the analog to digital converter can be greater than would otherwise be the case for a single stage digital to analog converter. In consequence, this means that the bandwidth of the input stage is reduced compared to the prior art converter. Normally, an engineer would consider a reduction of bandwidth to be disadvantageous, but in this context the reduction of bandwidth means that less noise is admitted into the analog to digital converter whilst allowing the front end of the analog to digital converter to accurately acquire the signal that is to be converted.

Additional stages can be added to the converter, such that three or more converter cores are provided in series and the transition from one converter core to the subsequent converter core is made by residue forming means for forming a residue between the voltage supplied to that converter core and the digitised version of that voltage as determined by that converter core. In a preferred embodiment of the present invention the first converter core exhibits 9 bit accuracy or greater, and the second converter core exhibits 8 bit accuracy or greater.

As noted before, the first conversion core may comprise a plurality of analog to digital converters operating in a collaborative state (except possibly for the first bit trial) so as to determine a plurality of bits per trial bit. The second conversion core may be arranged to perform all of its bit trials in a collaborative manner or, alternatively, only some of its bit trials may be performed in a collaborative manner. Thus, for example, the final few bit trials may be performed independently such that the effects of noise become uncorrelated between the converters. The results of the converters can then be summed to provide an output result.

Within the pipelined architecture of the present invention noise at the conversion engines of the second stage conversion core is not likely to be such an issue because the LSB (least significant bit) is much bigger (by a factor of the residue amplifier gain) than it would have been. Therefore the advantage in not performing collaborative bit trials towards the final determination of the LSB due to noise performance becomes of little significance. However, moving to non-collaborative testing for the final few bits in the conversion, does ensure that offsets or other mismatch errors between the conversion engines do not limit conversion accuracy.

Advantageously the analog to digital converter has more than three conversion engines in each conversion core. In a preferred embodiment the analog to digital converter has four conversion engines in each core, such an arrangement allows improved recovery from conversion errors. Generally speaking, at any bit trial, other than the first trial, the trial space is bounded to be one quarter of the size of the previous extent of the trial space. However as will be explained later, when using an extra conversion engine (optionally with additional bits included for the bit trial) the subsequent trial space can be made larger than one quarter of the size of the previous trial space and hence conversion errors resulting from settling and other errors can be corrected.

Advantageously, when proceeding from one trial to the next trial and using more than three conversion engines, the trial range is offset. In an embodiment of the present invention the trial range is offset by a value corresponding to half of the current step size (that is a value corresponding to half of the least significant bit being determined). This allows errors of either sign, to be corrected.

It should be noted that the redundancy allowed by the addition of the 4$^{th}$ converter engine provides correction of previous errors in the conversion without the cost of any additional bit trials. Of course it is possible to add redundancy while using just 3 converter engines but this requires additional redundant bits to be added which incur the cost of additional bit trials. This could, for example, be achieved by making the new trial range half, rather than one quarter, that of the previous bit trial and also offsetting the trial range to provide correction of errors of both (+ and −) sign.

A problem with using multiple conversion engines is that it is difficult to ensure that each of the engines is identical. Each conversion engine is likely to have a different voltage offset associated with it. Furthermore each conversion engine may also have a different gain error and an integral non-linearity error. This is unlikely to present a problem in the first conversion core as the size of the least significant bit that it converts is large by today's standards.

Collaborative bit trials in which at least 2 bits are determined each bit trial are only possible if mismatch between the conversion errors is less than weight of the bit being determined. To ensure that this is the case it may be necessary to perform the latter bit trials as non collaborative bit trials. It is then also possible to compensate the offsets between the three or more ADCs so they all match.

Advantageously if offset compensation is desirable one or more of the analog to digital conversion engines is provided with an offset compensation circuit. The offset compensation circuit may advantageously comprise a digital to analog converter for introducing an offset voltage to the conversion engine whose magnitude and advantageously sign can be controlled in order to correct for the offset within the associated conversion engine. Thus, over a series of conversion cycles the controller can examine the outputs of each of the conversion engines to see whether they agree. If one conversion engine repeatedly reads higher or lower than the others, then an offset can be applied to it, or to the others, or to a mixture of them to bring each of the output words into conformity. In order to maintain accuracy, the value of the sum of the offset words applied to each of the converters may be adjusted to maintain a preset value or alternatively the sum of the offset words may be formed and an appropriate correction applied to the final output word that is output by the controller.

Further improvements in error cancellation can be achieved by halting the conversion during the trial and setting all of the conversion engines to receive the same conversion word and then temporarily shorting analog output terminals of the capacitor banks within the conversion engines together in order to ensure that they all read the same voltage for the same digital word. This causes charge redistribution and compensates for gain and integral non-linearity (INL) errors between the conversion engines.

Where the latter bit trials are performed in a non collaborative manner, the performance of the converter may be further enhanced by deliberately introducing noise. The introduction of a random or pseudorandom noise or dither independently to each of the conversion engines once per conversion cycle where the resolution of the dither is smaller than one LSB improves this performance. Effectively the introduction of the dither allows the conversion engines to distinguish between analog values that are close to the LSB transition threshold and providing that the size of the dither is known then this can be used to provide an improvement in the resolution of the overall performance of the analog to digital converter. Such dither may need only be applied to the final (second) conversion core. The amount of dither added would generally be subtracted from the final digital word.

The conversion engines each include a comparator and may be followed by individual residue amplifiers or respective input stages of a shared residue amplifier. The comparator and amplifier input stages may be implemented as separate circuits or, due to similarities between these components, may be combined either wholly or partially.

As noted before, the conversion engines are generally made smaller so that a plurality of them can be provided without a corresponding increase in power consumption occurring. However making the capacitors within the sampling digital to analog converter stage of the ADC smaller gives rise to an increase in thermal noise. However, by connecting the individual outputs of the capacitor stages within the conversion engines in parallel, when generating the residue, the net thermal noise is reduced because the effective capacitance that determines the thermal noise is then the total capacitance of the individual ADCs.

According to a second aspect of the present invention there is provided a method of converting an analog value into a digitised equivalent, the method comprising the steps of:

i) sampling the analog value into a plurality of first stage conversion engines;

ii) operating the first stage conversion engines in a collaborative manner to perform a successive approximation conversion where at least two bits can be determined during a single trial step;

iii) digitising a first plurality of bits to form a first digital representation and forming a residue between the analog equivalent of the first digital representation and the analog value;

iv) amplifying the residue;

v) sampling the residue into a plurality of second stage conversion engines;

vi) operating the second stage conversion engines in a collaborative manner to perform a successive approximation conversion where at least two bits can be determined during a single trial step so as to determine a second digital representation; and vii) using the first and second digital representations to produce a digital output value.

BRIEF DESCRIPTION OF THE DRAWINGS

The present invention will be described, by way of example, with reference to the accompanying Figures, in which:

FIGS. 5a to 5f are worked examples of a bit trial;

DESCRIPTION OF PREFERRED EMBODIMENTS

Figure 1:
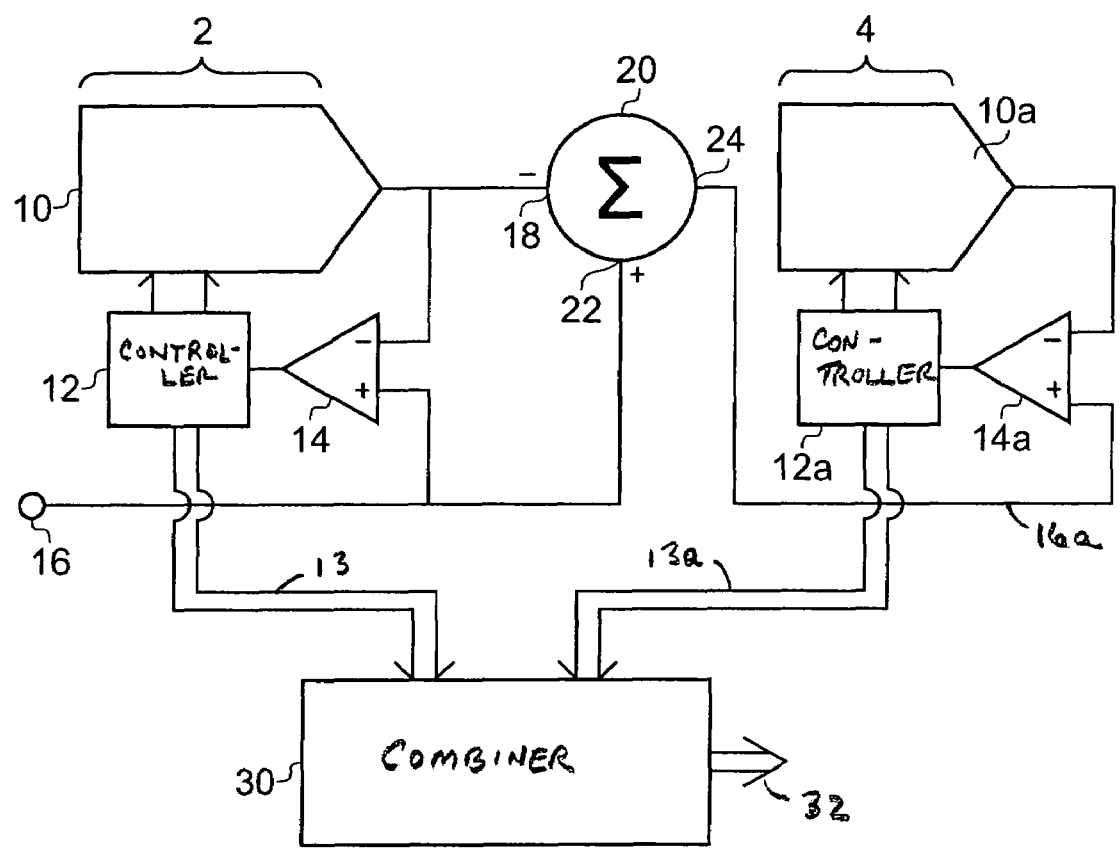
FIG. 1 schematically illustrates an analog to digital converter constituting an embodiment of the present invention.

FIG. 1 schematically illustrates an analog to digital converter constituting an embodiment of the invention. In essence two converter cores, generally labelled 2 and 4 (each comprising an analog-to-digital converter with both a digital output and an output supplying an analog representation of that digital output) are provided in series. The conversion task is split between the converters such that the first converter core 2 converts a first and most significant portion of the analog signal, for example the equivalent of the upper six to nine bits of a 16-bit word, and the second converter core 4 determines the remaining portion equivalent to, for example, the least significant bits of the analog to digital conversion.

In a preferred embodiment of the present invention both converter cores 2 and 4 are implemented as successive approximation converters. The converter cores 2 and 4 will be described in detail later. This allows each converter core to be relatively accurate without incurring the power and input capacitance costs of using a flash converter.

Returning to FIG. 1, it is beneficial to describe how the pipelined converter architecture shown in the FIG. works. For simplicity at this stage each converter core can be considered as comprising a digital to analog converter which is responsive to a respective controller 12 or 12a. A comparator 14 or 14a is provided which has one input connected to a converter input 16 or 16a which receives a sampled version of the analog signal that is to be converted from a sample and hold circuit (not shown). In use the controller successively sets a digital word which is converted by the digital to analog converter 10 or 10a. The output of the D/A converter 10 or 10a is compared to the input signal by comparator 14 or 14a. If the magnitude of the signal from the D/A converter is less than the magnitude of the signal to be converted then the bit under test is kept, otherwise it is discarded. The trial progresses from the most significant bit towards the least significant bit with, for any given bit in the trial, the results of the more significant bits being kept by the controller 12 or 12a and being provided in a trial word supplied to the digital to analog converter 10 or 10a.

Once the first conversion core 2 has digitized its portion of the signal, it sets the digital to analog converter 10 to output the result in analog form to a subtracting input 18 of a summer 20. An adding input 22 of the summer receives from input 16 the analog signal that is to be digitized. The summer 20 forms a residue as Residue=$V_{in}$-$V_{con1}$ where:

$V_{in}$ is the input voltage at the input 16, and $V_{con1}$ is the output voltage from the first converter core 2. This residue is held at an output 24 of the summer 20 and is used as the input voltage to the second conversion core 4, which is basically a copy of the first conversion core 2 with like parts being designated by like reference numbers appended by "a".

Each controller 12 and 12a sends its digitized word on outputs 13, 13a, respectively, to a combiner 30 which combines the results (and may make further corrections) to produce a single output word at 32 representing a digital version of the analog input signal.

In a preferred embodiment each conversion core comprises a plurality of conversion engines operating in a collaborative manner.

Figure 2:
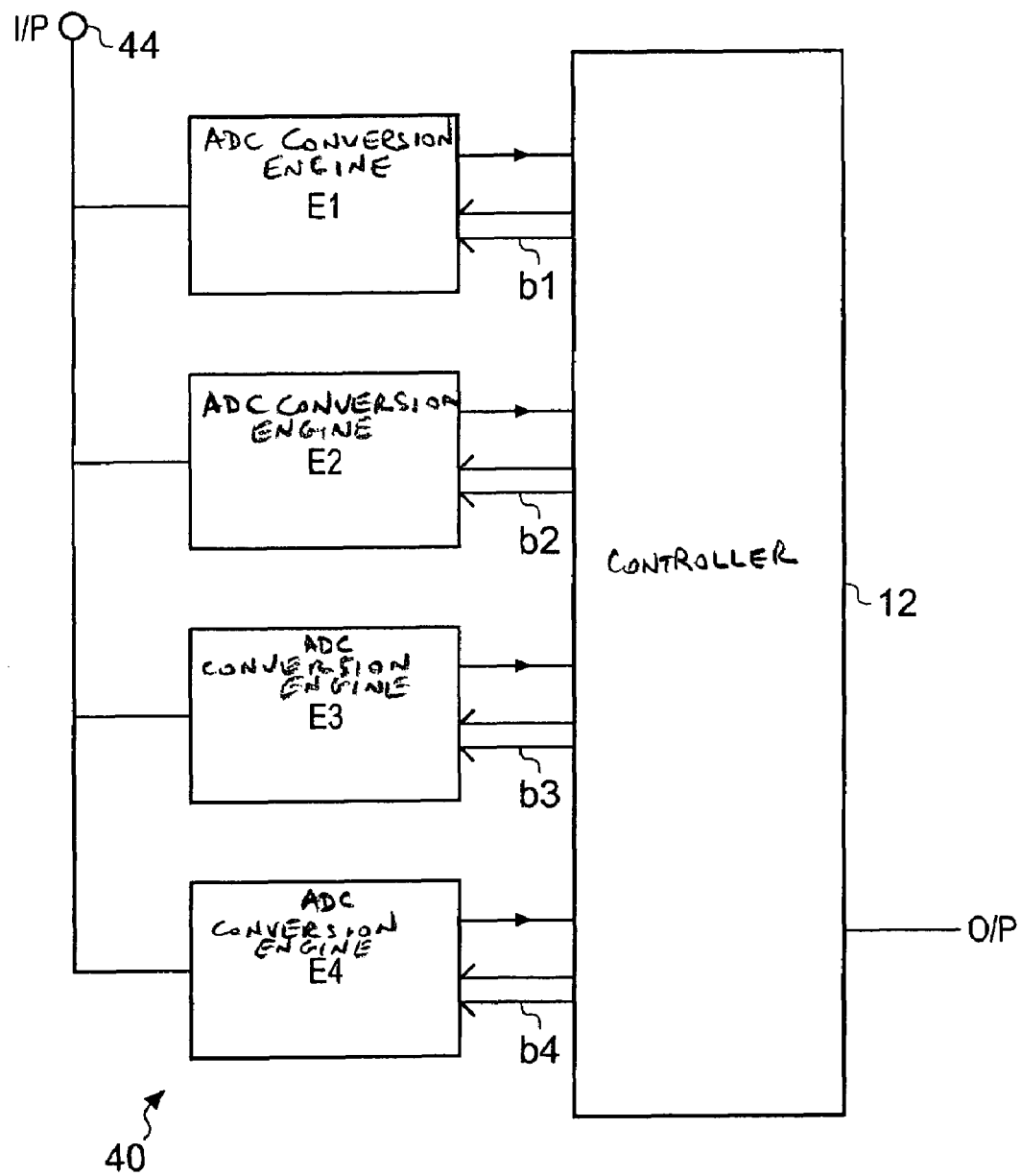
FIG. 2 schematically illustrates a plurality of conversion engines operating in a collaborative state within one of the converter cores of the analog to digital converter shown in FIG. 1.

FIG. 2 schematically illustrates a successive approximation analog to digital converter, generally labelled 40, constituting an embodiment of a conversion core of the present invention. The conversion core comprises a plurality of analog to digital conversion engines which, advantageously, are switched capacitor analog to digital converters having the occasional extra bit trial capacitor.

Three conversion engines labelled E1, E2 and E3 are required, although in a preferred embodiment of the present invention a fourth engine labelled E4 is also provided. Each of the engines E1 to E4 is in communication with the controller 12 which receives an output from a comparator provided internally within each of the conversion engines E1 to E4, and which also has a control bus designated B1 to B4 for controlling the switches associated with each of the capacitors in the respective conversion engine E1 to E4. Each conversion engine E1 to E4 is also connected to an analog input 44.

Figure 3:
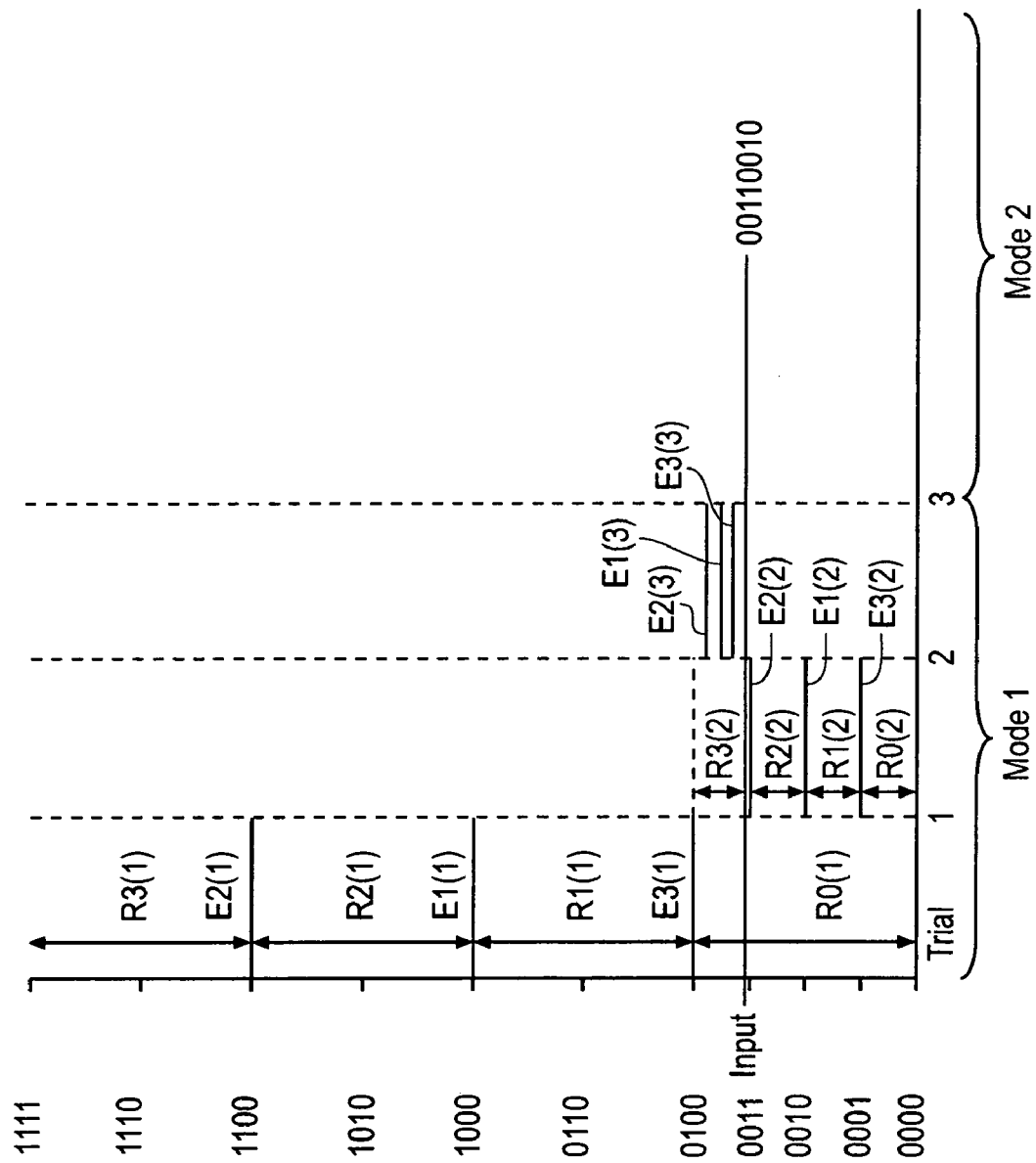
FIG. 3 schematically illustrates a conversion process using collaborative converters within a conversion core.

The operation of the converter core will now be described. Initially it is useful to consider the most basic form of the invention in which only three conversion engines are provided. FIG. 3 schematically illustrates the conversion process within either of the conversion cores for converting an 8 bit word where the converted value of the word corresponds to "00110010". The converter core is inherently capable of much greater levels of accuracy, but this example is deliberately kept simple for clarity and the pipelined architecture means that for a 16 bit converter each core needs at most to convert 10 bits, even allowing for some redundancy to correct for conversion errors. For consistency in the explanation we will assume that the first trial is a collaborative trial although in practise it is likely to be a single trial. During the first trial the first converter E1 is set such that its two most significant bits are set to "10" and the rest of its bits are set to "0", this condition is designated by the line E1(1). Converter E2 is set such that its most significant bits are set to "11" and the remainder of its bits are set to "0", this condition is designated by the line E2(1). Finally the third converter E3 is set such that its most significant bits are "01" and the remainder of its bits are set to "0". This condition is represented by the line E3(1). Referring to FIG. 3 it can be seen that the three converters segment the conversion space into four distinct ranges, the lowermost range, designated R0(1) spans the lowermost quarter of the conversion space, i.e. from "00000000" to "01000000". The next decision range designated R1(1) spans the next quarter of the input space, i.e. from "01000000" to "10000000". The next decision range, designated R2(1) spans the next quarter of the input space, that is from "10000000" to "11000000" and the final decision range, designated R3(1) spans the input range from "11000000" to "11111111".

At the end of the first trial, the outputs of the comparators, are checked and the controller notes that the analog input value is less than the threshold values E1(1), E2(1) and E3(1). As a result, the first two bits in the trial are set to "00"

and the trial then progresses to the second trial. Therefore we have already determined that the analog input signal lies within the range R0(1).

As can be seen in FIG. 3, the next trial when using three converters only conducts further investigations within the range represented by R0(1). Thus the next two bits of converter E1 are set to "10" such that the value under test becomes "0010" as represented by the line E1(2). The second conversion engine has its next two bits set to "11" such that it tests the word "0011". This value is represented by the line E2(2) in FIG. 3. Finally the third conversion engine has its next two bits set to "01" such that it tests the word "0001" as represented by the line E3(2).

Thus, each conversion engine is now checking a conversion range which corresponds to one quarter of the size of the previous conversion range. Thus the third conversion engine E3 is checking the conversion range R0(2) shown in FIG. 3 whose span is clearly one quarter of that of R0(1). Similar decision spaces R1(2) defined between the decision thresholds for the conversion engine E3 and the conversion engine E1 exists. Another decision range designated R2(2) exists between the decision threshold for conversion engine E1 and conversion engine E2, and finally the decision range R3(2) exists between the decision threshold for the conversion engine E2 and the decision range determined by the previous conversion. At the end of the second trial, the controller determines from the output of each of the conversion engines that the analog value was above the values determined by the next two bits for each of the engines, and hence the third and fourth bits in the trial are set to "11". As can be seen from FIG. 3, the next trial occurs only within the decision range R3(2) and again the three thresholds are set at the quarter, half and three quarter distances between the top and bottom of that decision range. It can be seen from FIG. 3 that each of these thresholds, designated E1(3), E2(3) and E3(3) corresponding to the decision thresholds for the first second and third conversion engines respectively is above the analog value. Therefore the controller discards each of these bits and hence determines that the word converted so far is "001100". It should also be noted, however that noise or settling errors occurring on any one of the conversion engines could have changed the result. The effect of noise is unlikely whilst the actual analog value remains fairly distant from the decision threshold but we can see that diagrammatically during the second trial noise occurring on the second conversion engine E2 could erroneously have caused it to signal that the analog value was below its decision threshold rather than above the decision threshold as is actually the case. Such noise would represent an irrecoverable error in the prior art. However in the present invention the analog to digital converters can recover from this because they include redundancy. Optionally the analog to digital converters switch operational modes after several trials have been performed, in this case after the third trial and move to a second mode where each of the analog to digital converters works independently as a single successive approximation converter independently of the others. The final result is then determined by combining the digital outputs of individual ADCs. Switching to independent operation for latter bit trials is preferred when offset or other mismatch errors between converter cores is of similar magnitude to the resultion of the bit trials being determined.

Furthermore, when digital to analog converters having redundant bits are used, these are able to recover from a previously mis-set trial decision and therefore the present invention would recover from the incorrect decision that might have occurred at trial 2 to return "00110010" as the output word as opposed to the prior art in U.S. Pat. No. 6,239,734 which, if it had made a wrong decision at trial 2 would return "00101111".

Having considered operation of the present invention with three conversion engines, it is now possible to see how the use of four conversion engines can be accommodated, and the benefits from such an approach.

Figure 4:
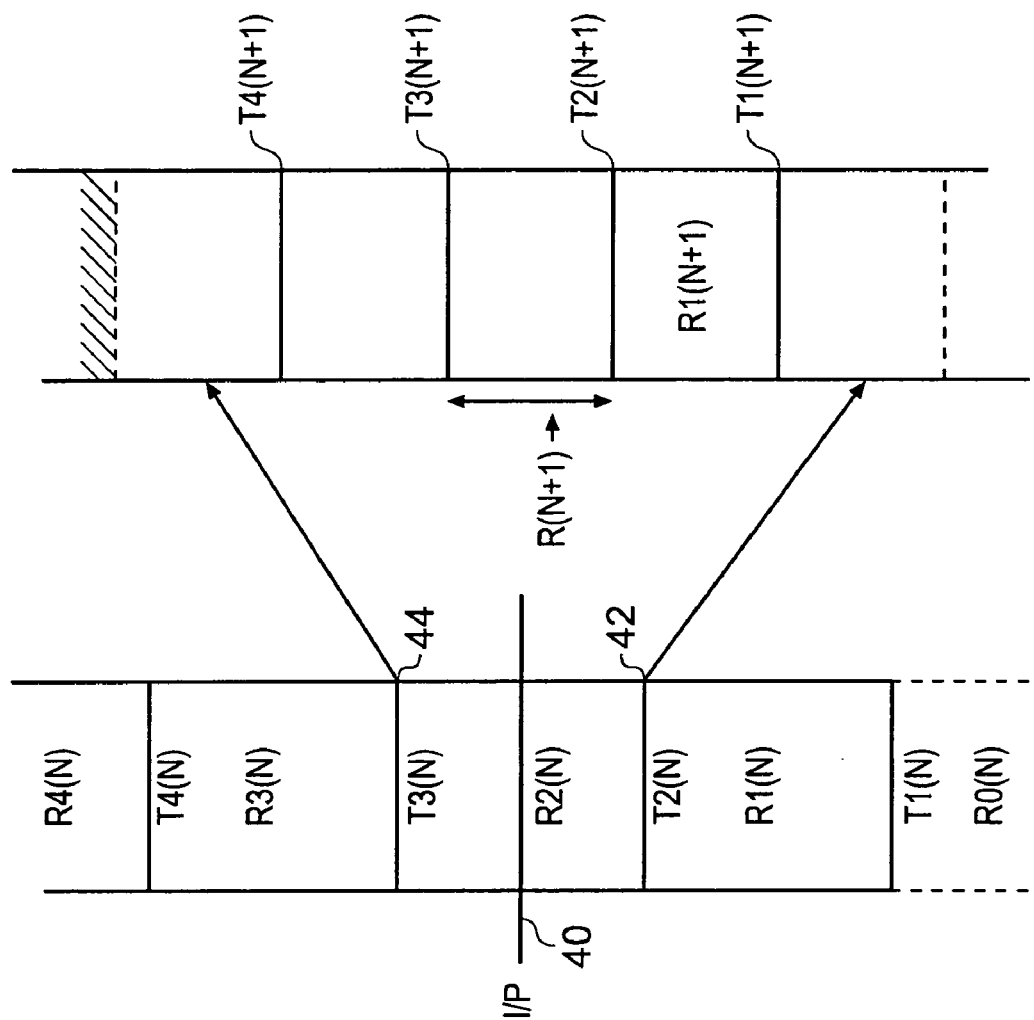
FIG. 4 schematically illustrates the relative positions in conversion ranges between a bit trial to determine a first two bits of the word and a second bit trial to determine third and fourth bits of a word.

When we move to the next example as set out in FIG. 4 we no longer have the simplicity of the three converter system and the nomenclature that was adopted to explain the three converter system is no longer appropriate. Instead each converter E1 to E4 tests, during an Nth bit trial its own conversion threshold T1(N) to T4(N) respectively against the input value.

It will also be apparent that, as with the earlier example, a search space exists between each pair of adjacent thresholds. Space R1(N) exists between threshold T1(N) and T2(N). Search space R2(N) exists between threshold T2(N) and T3(N), and similarly search space R3(N) exists between threshold T3(N) and T4(N). A search space R0(N) exists below threshold T1(N) and a search space R4(N) exists above threshold T4(N). This gives trial range redundancy as the search can recover from an error.

In a scheme using four conversion engines the resolution of each bit trial remains the same as that of a three converter engine However, the use of four converters allows the next trial range to be expanded. By offsetting the thresholds by ½ of the (N+1)th current least significant bit, recovery from previous incorrectly set or rejected bits can be achieved.

Thus, as shown in FIG. 4, the Nth trial determines that the input value 40 lies above T2(N) and below T3(N). In the prior art, the (N+1)th trial would be restricted to further refining the result in a search space banded by T2(N) and T3(N). In the present invention each search range R(N+1) is one ⁵⁄₁₆th of the size of the R(N)th search space, but the values of the thresholds have themselves been offset, in this example downwardly, by 0.5R(N+1). As a consequence the next search is made in a space that spans from T2(N)−⅛(T2(N)−T1(N)) to T3(N)+⅛(T4(N)−T3(N)).

It is useful to consider several worked examples to see how a converter core operates both without the range expansion, and with both the range expansion and the inclusion of redundant bits.

In each of the FIGS. 5a to 5f multiple conversion engines are operating in a collaborative mode. The trial number is denoted by T1, T2 and T3 for the first, second and third trials respectively. Within any given trial the conversion engines are set to different bits values. Each engine is denoted E1, E2 and so on, respectively.

The bit weights are represented in each trial. In some examples additional (redundant) bits are provided, and they are designated by the letter "R". Also shift weights or negative weights are also provided. These are designated by the term "S". Negative weights are formed from real capacitors whose switching is effectively inverted compared to the "normal" positive weight capacitors.

In the example illustrated in FIG. 5a, the capacitors are provided in a binary array and have weights 32, 16, 8, 4, 2 and 1. Suppose, using this array we wish to digitise an analog signal that has a value of 24.75.

In the first trial, T1, the first conversion engine E1 has the 32 and 16 bits set to 0 and 1 respectively. This gives a total of 16. Hence the conversion engine determines that the value it is testing is less than the analog input signal.

Conversion engine E2 has the 32 and 16 bits set to 1 and 0 respectively, giving a value of 32, which the converter determines is too big compared to the analog input.

The third converter has its 32 and 16 bits set to 1 and 1 respectively, giving a value of 48 which is also too big.

As only E1 had a value which was less than the analog value, its bits 01, are carried forward to the second test.

In the second trial, T2 each engine has its 32 and 16 bits set to 0 and 1 respectively. The next most significant bits having weights 8 and 4 are tested with each engine repeating the 01 for E1, 10 and E2 and 11 for E3 sequence. In this trial both E1 and E2 have values less than the analog value being tested. Thus E3 is discarded and the higher value of E1 and E2, i.e. E2, is kept and taken forward to the next trial. This number corresponds to the value 24.

In the third trial all of the trials are discarded because each has a value greater then the value being tested. Therefore, in this example "011000" is the correct answer.

FIG. 5b shows what appears in the same converter if noise in conversion engine E1 causes it to return an incorrect result thereby causing the first bits to be incorrectly set to 00. It can be seen that the converter never recovers from this error and in the end returns a value of 15.

FIG. 5c shows the conversion, this time being performed with ADC engines having a bit weight sequence 32, 16, 16, −8, 8, 4, 4, −2, 2, 1, 1, −0.5.

In each trial, four conversion engines are used, with the most significant bits being tested at each stage being set to 00, 01, 10 and 11 for engines E1 to E4 respectively. Also each pair of bits being trialled are associated with a redundant bit and a shift bit.

It can be seen that in the first trial T1 of FIG. 5c the 32 and 16 bits are trialled, and the 16 redundant bit and a −8 shift bit are set for all four engines. Thus the values which are tested amount to 8, 24, 40 and 56. As the value being tested corresponds to 24.75, the first trials from the engines E1 and E2 are less then the analog value whereas the trials from E3 and E4 are too big. Therefore the largest value which is less than the value being tested, i.e. the output of E2, is carried forward to the next stage of the trial.

The value carried forward includes the contribution from the redundant bit and the shift bit.

At the next stage, T2, the 8 and 4 weighted bits are trialled, with a redundant 4 bit being set and a −2 shift bit also being set. In each trial in T2, the output value is too big compared to the analog value being tested. Consequently the 8, 4 and redundant 4 bits are cleared. The −2 shift bit is retained. Note that in all cases once the shift bit has been set it remains set till the end of the conversion.

In the third trial T3, the process is repeated on the next group of bits, which have values 2, 1, 1, −0.5. During the third trial, the largest value which is not too big is correctly selected to be 24.5. This is the correct answer as the input lies between 24.5 and 25.5.

The final trial in this example may be split into two trials T3 and T4 with each converters working independently such that thermal noise is uncorrelated in each converter and each comes to an individual result. In this case the trial weight of 2 would be tested in bit trial T3 and the trial weight of 1 would be tested in an additional bit trial T4. R and S would then not be set for these 2 trials. The output of the 4 converters can simply be added together. The result is 4 times too big, but can be normalised by dividing by 4, which in its simplest implementation simply means discarding the last two bits.

Alternatively the converters may still work in a collaborative manner at this stage. This is a design choice made by the designer, and would be mainly determined by the expected matching between the conversion engines.

FIG. 5d shows the same trial being conducted, but an error in the first trial, due for example to noise, causes conversion engine E2 to incorrectly indicate that its value is too big. Thus the selection carried forward into the second trial T2 is significantly under weight. Nevertheless, the extra weight provided by the redundant bits allows the correct answer to be determined by the end of the third trial.

FIGS. 5e and 5f repeat the process of FIGS. 5c and 5d. However, it can be seen that the most significant value in each trial has been split into two further capacitors. Thus the 32 value bit capacitor in the ADC engines are replaced by two 16 value bit capacitors. Similarly in the second trial the 8 value bit is replaced by two 4 value bits, and so on. This means that, starting from the least significant bit, the values in the ADC are $-2^{-1}, 2^0, 2^0, 2^0, 2^0, -2^1, 2^2, 2^2, 2^2, 2^2, -2^3, 2^4, 2^4, 2^4, 2^4,$ and so on.

The converters are formed from well known switched capacitor technology devices and hence the architecture and specific fabrication of the converters is not of primary interest here.

Figure 6:
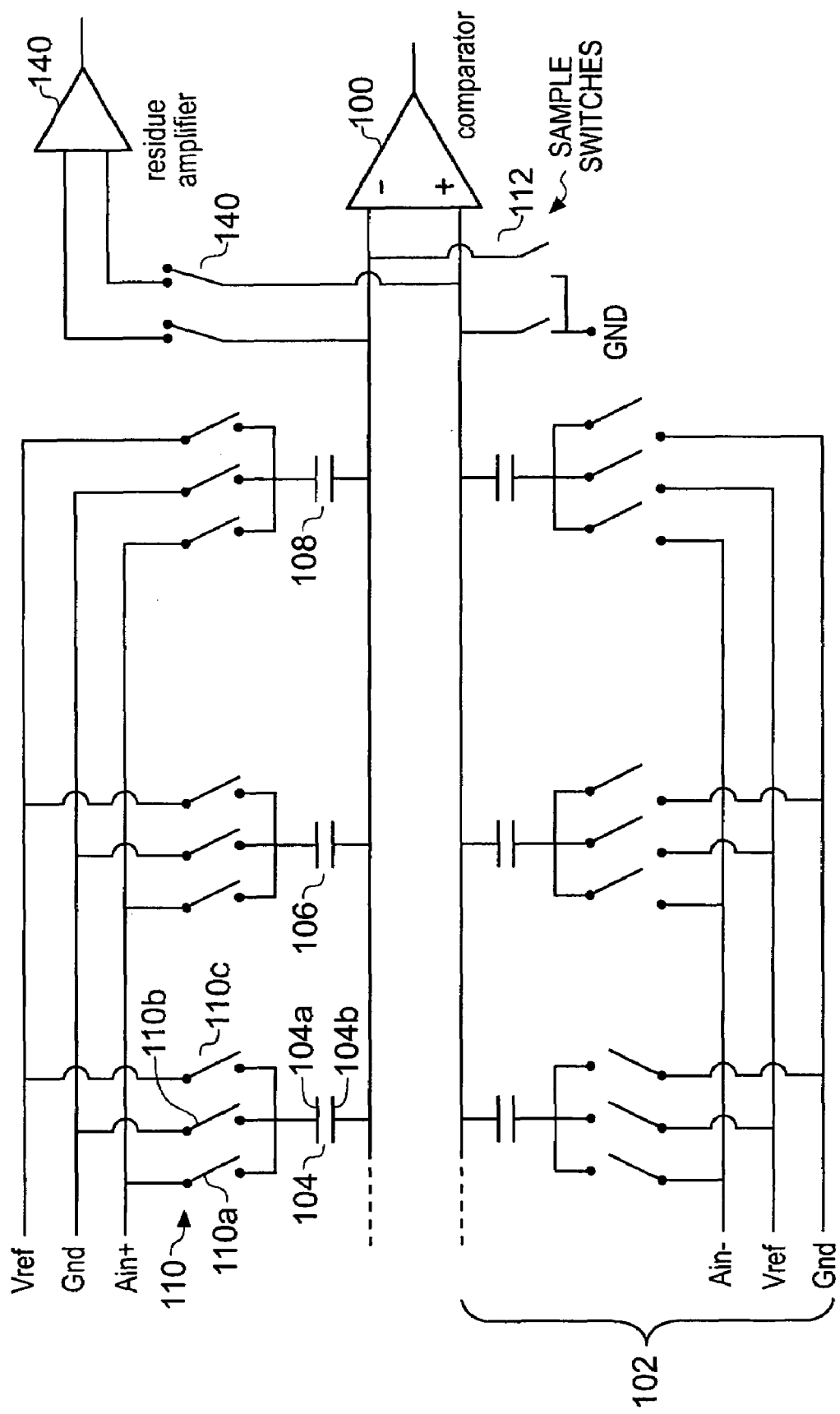
FIG. 6 illustrates a single switched capacitor ADC conversion engine, several of which are provided within a single conversion core.

Although the switched capacitor input stage topology is well known to the person skilled in the art, it is worth briefly considering it in more detail. FIG. 6 schematically illustrates a simplified representation of a single switched capacitor analog to digital conversion engine. In general, the conversion engines may operate in a differential mode (illustrated) and hence capacitor banks connected to both the non-inverting and inverting inputs of a comparator 100 have been illustrated. However, for simplicity, we may assume that the conversion engine only operates in a single ended manner and hence all the capacitors and switches associated with the inverting input, and generally designated 102 can be omitted and the inverting input can be connected to ground. Considering the capacitors associated with the non-inverting input, the capacitors 104, 106, 108 represent exemplary capacitors within a larger capacitor array. The capacitors 104, 106 and 108 are nominally binary weighted, although as discussed earlier on some of the capacitor values may be repeated in order to provide redundancy within the array which can be exploited to reduce the settling time prior to testing a digital approximation against the analog input value. Each capacitor is selectively connectable by a respective bank of electronic switches to either an input line, $A_{in+}$, a ground line designated GND or a voltage reference line designated $V_{ref}$. For simplicity a bank of three switches designated 110 and associated with the capacitor 104 will be considered. In operation, the signal to be converted can be sampled on to the capacitors 104, 106 and 108 of the capacitor array by closing their respective switches to connect a first plate (104a is an example in respect of the capacitor 104) of the capacitors to the signal input $A_{in+}$, whilst a sample switch 112 is closed so as to ground a second plate (104b is an example) of each of the capacitors. Therefore current flows from the input so as to charge the capacitors up to the input voltage. It should be noted that since the capacitors are real world components they will exhibit a finite internal resistance and also the signal path from an input pin on the casing of the analog to digital converter to the capacitors via electronically controllable switches (FETs) will also exhibit resistance. Therefore the charging of the capacitors is not instantaneous but instead is determined by an RC time constant. Once the capacitors are charged, the switch to the sampling line $A_{in+}$ is opened, as is the sample switch 112. The switches 110b and 110c connecting the capacitor 104 to either ground or the voltage reference, respectively, and the corresponding switches for the other capacitors are then for any single capacitor driven in anti-phase such that the voltage reference and the ground lines are never connected together but that, during a bit trial, each of the first plates of the capacitors are either connected to ground or to the voltage reference. During this phase all the second plates of the capacitors are connected to a common node and hence the capacitors form their own potential divider sharing the charge that was sampled onto their plates during the sampling phase between them at each test of a digital word in the successive approximation conversion process.

During the bit trials the voltage occurring at the non-inverting input of the comparator 100 rises or falls as the digital words are selectively tested. The comparator 100 is also a real world device and hence its non-inverting input exhibits a parasitic capacitance. Consequently the charge from the capacitor array will accumulate on the parasitic capacitor and the amount of charge which is effectively lost from the switched capacitor array will be a function of the input voltage. This loss of charge to the input stage of the comparator could result in conversion errors occurring—for example by incorrect calculation of the residue voltage. It is desirable to ensure that the charge accumulated on the parasitic capacitor is always the same. This can be achieved by a modification of the input stage of the comparator 100.

Figure 7:
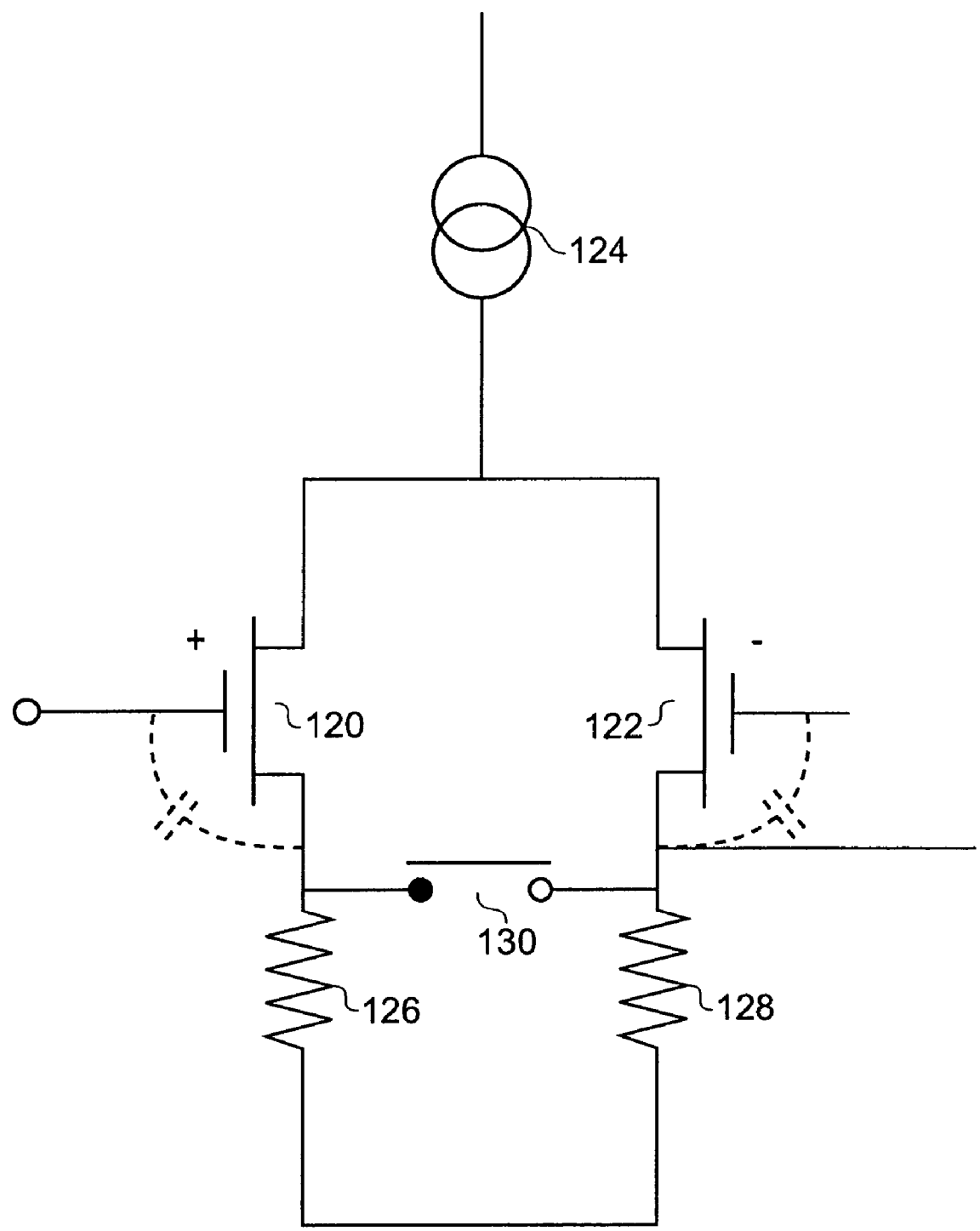
FIG. 7 illustrates the input stage of a comparator.

FIG. 7 schematically illustrates the input stage of the comparator 100. As is common in comparator and operational amplifier design the input stage comprises a long tail pair, in this example implemented by field effect transistors 120 and 122 receiving current from a current source 124. Each transistor has an associated load, in this example represented by resistors 126 and 128 although, in practise, the loads might be formed by active components. The parasitic input capacitors effectively extend between the gate inputs of the transistors 122 and their connection to their respective loads 126 and 128. The input stage can be modified by including a shorting switch 130, which would be implemented by a field effect transistor, which can ensure that one of the plates of the parasitic capacitors is always held at the same and constant voltage once the conversion process has been completed. In practice the current source 124 acts to ensure that a constant current is delivered to the transistor pair 120 and 122. This current then flows to the supply rail via the resistors 126 and 128. It therefore follows that if the shorting switch 122 is closed, thereby connecting the resistors in parallel, the voltage occurring at the node between transistor 120 and resistor 126 will always be the same, and hence the change stored on the parasitic capacitor becomes predicable. Indeed, if the shorting switch 122 is closed during the sampling period onto the main capacitor array and again during formation of the residue then the effect of this capacitor is nullified. This means that the lost charge is no longer dependent upon the digital word being converted and hence the voltage formed by the residue amplifier 140 which performs the functionality of the summer 20 shown in FIG. 1, will no longer be subject to systematic variation as a function of the input voltage on the $A_{in+}$ sampling line.

Returning to FIG. 6, once each of the conversion engines within the first conversion core has reached the end of the conversion process, switches 140 which had previously been opened (high impedance state) are closed such that each capacitor array is connected in parallel to the single shared residue amplifier 140. At this time, the controller 12 has set each of the capacitor arrays to the same identical value, even if the conversion results of the four arrays have not been identical, such that the voltage residue formed at the residue amplifier 140 correctly represents the result of subtracting the digitised word from the sample analog value. It would, of course, be possible to use only one of the conversion engines to drive the residue amplifier and, in the absence of noise, this would achieve the correct result. However given that real world components exhibit noise, using the capacitor arrays of the conversion engines to drive the input of the residue amplifier 140 in parallel reduces the effect of thermal noise on the performance of the converter.

The residue amplifier can be used to apply a gain to the residue thereby effectively making the single least significant bit step size that has to be determined by the second converter core much larger than would have been the case if the signal had been converted within a conventional successive approximation converter having only one conversion core.

Technical prejudice in the field of pipeline converters suggests that the gain should be very low, for example unity. However the inventors have realised that, in the context of the present architecture, this prejudice is unwarranted and that gains in the region of 30 to 150 odd are possible, and that for convenience gains of 32, 64 or 128 are preferred. In a presently preferred embodiment the gain of the residue amplifier is set to 64.

The residue amplifier may be just a simple voltage gain amplifier. However for higher accuracy feedback capacitors between outputs and corresponding inputs can be added. The gain is then set by the ratio of the total value of the capacitor arrays switched to the inputs of the amplifier divided by the feedback capacitor. Prior to forming the residue, the voltage across the feedback capacitors can be reset to a known value. Such an arrangement is common in pipeline converters and is well known to those skilled in the art.

The residue occurring at the output of the first converter core is small. If we consider the case of a converter having an input voltage that can span between zero and 10 volts, and the first converter core converts to 9 bit accuracy, then the voltage range occurring at the input to the residue amplifier would be between zero and 0.02 volts. Therefore even when a gain of 64 is applied the maximum output voltage occurring at the residue amplifier is still only in the order of 1.25 volts. This is only in the region of 1/10 of the conversion range that can be covered by the second stage converter, and if no account was made of this then effectively three bits of conversion accuracy would be lost from the second stage converter. In order to compensate for this gain change, a capacitive divider is used to interface the second converter core to its comparator and to the output of the residue amplifier. This arrangement is shown in FIG. 8.

Figure 8:
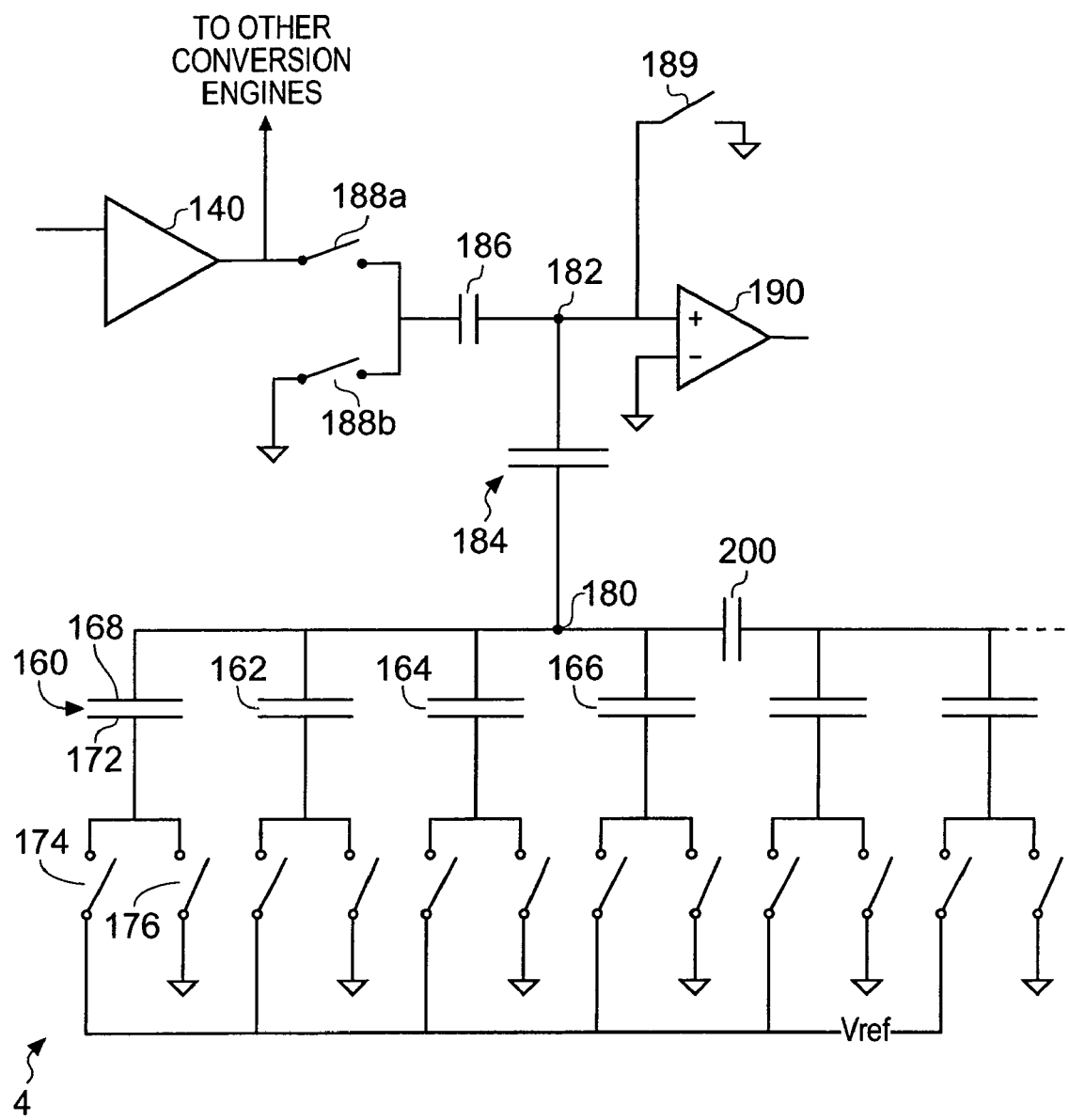
FIG. 8 illustrates the second ADC core and it's relation to only one of the conversion engines.

As shown in FIG. 8 a conversion engine of the second converter core, generally designated 4, comprises a plurality of capacitors of which only a few capacitors 160, 162, 164 and 166 have been shown. Each capacitor has a first plate, of which only the plate 168 of capacitor 160 will be referred to which is connected to a common node 180. A second plate of each capacitor, of which only plate 172 of the first capacitor 160 has been designated, is connectable by respective electronic switches (of which switches 174 and 176 are associated with the first capacitor 160 are examples) to either ground or to a voltage reference $V_{ref}$. The switches 174 and 176 are under the command of a controller 12*a* (see FIG. 1) and are operated in a manner known to the person skilled in the art of a switched capacitor array analog to digital converter design. The node 180 is connected to a further node 182 by a capacitor 184 and the node 182 is selectively coupled to either the output of the residue amplifier 140 or to ground via a further capacitor 186 via electronically controllable switches 188a and 188b which are driven in anti-phase. A non-inverting input of a comparator 190 is also connected to the node 182. Once the residue has been formed by the residue amplifier 140, it is sampled onto the capacitor 186.

The sampling on to the array is effectively a two stage process. Initially switch 188b is opened and then switches 188a, and 189 are closed. This enables a charge to be sampled on to capacitor 186. Switches 188a and 189 are then opened and switch 188b closed.

The converter core 4 can then be driven in a successive approximation search to present a test voltage at node 180 which is effectively attenuated by capacitor 184 which forms a capacitive potential divider with capacitor 186 thereby reducing the voltage window that the analog to digital converter ranges over. By appropriate selection of the relative values capacitors 184 and 186 the effective range of the analog to digital conversion core can be scaled to cover the output voltage range of the residue amplifier 140. In a currently preferred embodiment the capacitor 186 has a value twice that of the capacitor 184. The capacitors 160, 162, 164 and 166 are conveniently binary weighted. However, as is known to the person skilled in the art it is possible to form further capacitive voltage dividers within the analog to digital converter core 4 by placing a series of connected capacitors between banks of the sampling capacitors. Capacitor 200 represents such a capacitor.

Figure 9:
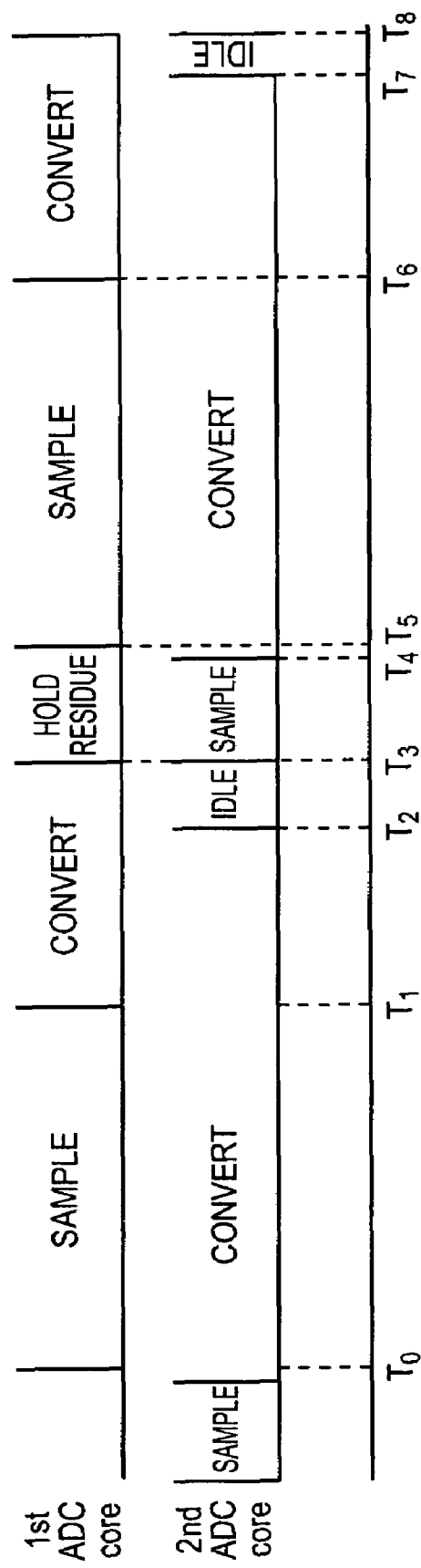
FIG. 9 is a timing diagram showing the relative operations of the first and second ADC cores.

FIG. 9 is a timing diagram representing the relative operations of the converter cores. The cores operate in a cyclic manner. However consider a situation where the converter has been operating for a while and we are just about to make an Nth conversion in a series of conversions. A time T=0 the first converter core begins sampling the analog value that is to be converted. At time T=1 the first conversion core holds the value that is sampled and initiates its analog to digital conversion process in a time period spanning T1 to T3. Meanwhile the second ADC core is finalising the conversion of the proceeding N−1th word and its conversion stops at a time T2 which precedes T3. At time T3 the first converter core has converted its result and now operates to calculate an analog residue and to present this at the output of the residue amplifier 140. The residue is presented in a time period spanning T3 to T5. During this period, commencing at T3, the second converter core commences sampling the residue amplifier and finishes sampling the residue at a time period T4 preceding T5. Once the second ADC core has sampled the residue value it can commence performing its analog to digital conversion in the period spanning T4 to T7. Meanwhile the first ADC core can sample the N+1th analog value in the period spanning T5 to T6 and start converting it in the period spanning T6 to T8.

In this scheme as set out above the analog to digital converter can afford to have a longer sample time (T0 to T1) in order to acquire the sample whilst allowing the conversion within each conversion core to be performed at approximately twice the speed of a conventional successive approximation converter due to the co-operative nature of the conversion engines, and each conversion core effectively only has to convert half the number of bits that would need to be converted by a conventional successive approximation analog to digital converter. It can therefore be seen that even allowing for an increased sample time so as to reduce the noise bandwidth of the converter and thereby prove its signal to noise performance, the converter can still deliver conversion rates in excess of twice the conversion rate that could be achieved by a conventional successive approximation converter.

There are improvements and modifications that can be made to the scheme disclosed here. For example each collaborative ADC may have its own residue amplifier rather than sharing a common residue amplifier. In which case, the output of the individual residue amplifiers must be combined. This can be achieved by instantiating the input network, shown in FIG. 8, comprising switches 188a and 188b and capacitor 186 R times where R is the number of residue amplifiers. Each instantiation of switch 188a is then connected to it's corresponding residue amplifier output. In such an arrangement the comparators at the output stage of the first analog to digital conversion core and the residue amplifier could be merged into a single cell as both a residue amplifier and the comparators have a pre-amplification stage which may look similar. It can also be seen that more conversion engines could operate in parallel within a converter core.

It can be seen that three bits could be set in one go using the principle of the present invention. This would require a minimum of $2^3-1=7$ converter engines but preferably $2^3$ converter engines would be provided so as to provide for range extension.

Each converter E1 to E4 will inherently have its own offset. Offset and gain errors will have been reduced at the time of manufacture by the manufacturer, nevertheless it remains possible that some offset will remain. Offset compensation can be achieved dynamically within the present invention so as to improve its performance. Thus each conversion engine E1 to E4 may be associated with a respective offset correction circuit which can generate an offset in response to control signals from the controller 12.

Where the latter bits trials are operated in a non-collaborative manner it will be apparent that, over many samples, each converter should output the same value, as they have a common input. Therefore the controller need only keep a running total of the output of each converter over a sufficiently large number of conversions in order to detect if one converter has an offset relative to the other converters. The controller can then set an offset correction via one or more of the offset correction circuits. In a preferred implementation the offset correction circuits are digital to analog converters. Given that only relative offsets can be compensated for in this way it is desirable that the value of each offset correction is adjusted such that the sum of the corrections is a near constant value.

Further improvements in performance, and resolution, can be achieved by adding a small dither to each conversion engine in the second conversion core 4 when the latter bits are operated in a non-collaborative manner. Each dither is of a known size and each engine has a different dither applied. A single value of dither per conversion engine can be kept for a complete analog to digital conversion. The dither can push a converter over a conversion threshold such that it returns a different value. In the absence of noise different levels of dither can be used by the controller to infer the input voltage to better than 1 LSB accuracy.

It may also be advantageous for the first bit trial of either conversion core to be a single bit (non-collaborative) trial. This reduces the possibility of voltages within the switched capacitor array occurring that might switch on parasitic components within the integrated circuit.

It is thus possible to provide an improvement in conversion speed of an analog to digital converter.

The invention claimed is:

1. A analog to digital converter, comprising:
an input for receiving an input signal to be digitised;
a first converter core for performing a first part of an analog to digital conversion, said first converter core comprising at least three switched capacitor analog to digital conversion engines operating in parallel and in a co-operative manner and for outputting a first digital result and an analog representation of the first digital result;
a first residue generator for generating a first residue as a difference between the input signal and the analog representation of the first digital result;
a second converter core for performing a second part of the analog to digital conversion by converting the first residue;
wherein
the analog to digital further comprises a controller for controlling the operation of the engines such that the engines co-operate to perform a successive approximation search, and wherein the first converter core is further operable to act as the first residue generator.

2. An analog to digital converter as claimed in claim 1, wherein at least one of the converter cores can determine a plurality of bits during a single trial step within that converter core.

3. An analog to digital converter as claimed in claim 1, in which each conversion engine includes redundant bits and a controller associated with the conversion engine converts the result from the conversion engine into a binary word.

4. An analog to digital converter as claimed in claim 1, wherein the conversion engines of the first conversion core are connected in parallel during generation of the residue so as to reduce thermal noise.

5. An analog to digital converter as claimed in claim 1, further comprising a first amplifier for amplifying the first residue.

6. An analog to digital converter as claimed in claim 5, in which the amplifier applies a known gain.

7. An analog to digital converter as claimed in claim 5, in which the amplifier has a gain which is nominally a power of two.

8. An analog to digital converter as claimed in claim 1, in which the second conversion core comprises a plurality of analog to digital conversion engines operating in parallel in a co-operative manner.

9. An analog to digital converter as claimed in claim 1, in which a capacitive potential divider is provided in association with the second converter core so as to modify a conversion range of the second conversion core.

10. An analog to digital converter as claimed in claim 1, wherein the conversion engines include redundant bits.

11. An analog to digital converter as claimed in claim 10, wherein at least some of the redundant bits are comprised of a redundant bit associated with a shift bit.

12. An analog to digital converter as claimed in claim 1, in which at least one of the converter cores comprises at least four converters, and a trial range tested by the converters is greater than and includes a range of analog values determined as a preceding least significant bit at an immediately preceding bit trial.

13. An analog to digital converter as claimed in claim 1 wherein, for a first bit trial, only 1 bit is determined by the first converter core.

14. A method of converting an analog signal into a digitised value, comprising the steps of:
receiving an input signal to be digitised, using a first converter core to perform a first part of an analog to digital conversion and outputting the result of a first digital result;
forming a residue as a difference between the input signal and the first digital result;
using a second converter core to perform a second part of an analog to digital conversion by converting the first residue; and
wherein the first conversion core comprises at least three switched capacitor successive approximation conversion engines operable to determine two bits per bit trial, and wherein the first trial only trials one bit.

15. A method of converting an analog value into a digitised equivalent, the method comprising the steps of:
i. sampling the analog value into a plurality of first stage conversion engines;
ii. operating the first stage conversion engines in a co-operative manner to perform a successive approximation conversion where at least two bits can be determined during a single trial step;
iii. digitising a first plurality of bits to form a first digital representation, and forming a residue between the analog equivalent of the first digital representation and the analog value;
iv. amplifying the residue;
v. sampling the residue into a plurality of second stage conversion engines;
vi. operating the second stage conversion engines in a co-operative manner to perform a successive approximation conversion where at least two bits can be determined during a single trial step so as to determine a second digital representation; and
vii. using the first and second digital representations to produce a digital output value.

16. An analog to digital converter comprising:
a first stage having a plurality of conversion engines adapted to operate in a co-operative manner such that they perform a successive approximation search where two bits are determined during a trial step and where the first stage acts to form a first digital word representing a first portion of an analog signal;
an amplification stage for receiving an analog signal from the first stage representing a difference between the analog signal and an analog representation of the digitised first portion of the analog signal;
a second stage having a plurality of conversion engines adapted to operate in a co-operative manner such that they perform a successive approximation search where two bits are determined during a trial step and the second stage forms a second digital word; and
a combiner for combining the first and second digital words to produce an output word.

17. An analog to digital converter as claimed in claim 16, where each conversion stage comprises four conversion engines for trial range redundancy.

18. An analog to digital converter as claimed in claim 16, where each conversion engine is a switched capacitor conversion engine having redundant bits.

* * * * *